(12) United States Patent
Monoi

(10) Patent No.: US 6,954,230 B2
(45) Date of Patent: Oct. 11, 2005

(54) SOLID IMAGE PICKUP APPARATUS

(75) Inventor: Makoto Monoi, Tokyo-To (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 845 days.

(21) Appl. No.: 09/907,945

(22) Filed: Jul. 19, 2001

(65) Prior Publication Data

US 2002/0033892 A1 Mar. 21, 2002

(30) Foreign Application Priority Data

Jul. 19, 2000 (JP) ........................................ 2000-219023

(51) Int. Cl.[7] .............................................. H04N 3/14
(52) U.S. Cl. ..................................... 348/303; 348/294
(58) Field of Search ............................... 348/294, 300, 348/302, 303, 308, 311, 316, 319, 320

(56) References Cited

U.S. PATENT DOCUMENTS

| | | | | |
|---|---|---|---|---|
| 5,107,137 A | * | 4/1992 | Kinugasa et al. | 327/203 |
| 5,515,010 A | * | 5/1996 | Peterson | 330/288 |
| 5,712,859 A | * | 1/1998 | Hori et al. | 714/724 |
| 6,563,541 B1 | * | 5/2003 | Nakashiba | 348/324 |
| 6,636,073 B2 | * | 10/2003 | Yonemaru | 326/87 |
| 2004/0159845 A1 | * | 8/2004 | Matsumoto | 257/88 |

* cited by examiner

Primary Examiner—Wendy R. Garber
Assistant Examiner—Jacqueline Wilson
(74) Attorney, Agent, or Firm—Oblon, Spivak, McClelland, Maier & Neustadt, P.C.

(57) ABSTRACT

A solid image pickup apparatus which is not easily susceptible to an influence of an emitted light caused by impact ionization. The solid image pickup apparatus of the present invention includes an output circuit for converting a signal charge outputted from a photoelectric converter into an analog signal and outputting the signal. The output circuit includes a charge-voltage converter for converting the charge transferred from the photoelectric converter into a voltage signal, a plurality of source follower circuits for performing impedance conversion, and a reverse amplification circuit. A gate length of a MOSFET constituting the final-stage source follower circuit in the output circuit is longer than the gate length of the MOSFET of another source follower circuit or the like. Therefore, impact ionization does not occur in a position in which the impact ionization most easily occurs, the emitted light caused by the impact ionization does not enter the photoelectric converter, and an image quality can be prevented from being deteriorated.

5 Claims, 3 Drawing Sheets

SOLID IMAGE PICKUP APPARATUS

CROSS REFERENCE TO RELATED APPLICATIONS

This application claims benefit of priority under 35 USC Sec. 119 to Japanese Patent Application No. 2000-219023, filed on Jul. 19, 2000, the entire contents of which are incorporated by reference herein.

BACKGROUND OF THE INVENTION

1. Field of the Invention

The present invention relates to a solid image pickup apparatus for transferring a signal charge photoelectrically converted by a photoelectric converter such as a photodiode, particularly to a technique for preventing impact ionization to enhance an image quality.

2. Related Background Art

Examples of a typical solid image pickup apparatus include a CCD image sensor. The CCD image sensor is easily integrated, and therefore broadly used in a scanner, digital copying machine, video camera, and the like in which a large number of pixels are required.

FIG. 7 is a plan view showing a schematic configuration of the CCD image sensor. The CCD age sensor of FIG. 7 includes: a photoelectric converter 11 in which a plurality of photosensitive pixels 10 are linearly arranged, a CCD register 13 for transferring a signal charge photoelectrically converted by the photoelectric converter 11 and subsequently sent via a shift electrode 12 in a direction of arrows in FIG. 7, and an output circuit 14 for outputting an analog signal in accordance with the signal charge moved to the end of the CCD register 13.

In recent years, with an increase of speed of an electronic apparatus, there has been an increasing demand for an increase of an output data rate of the CCD image sensor. Because of this, the speed is raised by shortening a gate length of MOSFET in the output circuit 14, enhancing a driving ability of MOSFET, or increasing a current flowing through the circuit.

However, when the gate length of the MOSFET is shortened, an electric field between source and drain is heightened, and an electron/hole pair is generated by impact ionizations. It is known that the electron/hole pair is recombined to emit light as shown it FIG. 8 (authored by Takeda, Nikkei MacGrow Hill Co., "Hot Carrier Effect", p 37, 1987).

Additionally, in FIG. 8, reference numeral 30 denotes a gate electrode, 31 denotes a source region, and 32 denotes a drain region.

When the light reaches the photoelectric converter 11 of FIG. 7, the signal charge attributed to the light is generated by the photoelectric converter 11, and this deteriorates an image quality.

SUMMARY OF THE INVENTION

According to the present invention, there is provided a solid image pickup apparatus comprising:

a photoelectric converter; and an output circuit, configured by connecting in series a plurality of stages of circuit blocks of at least one of a source follower circuit and an inverter, configured to output an electric signal in accordance with a signal charge photoelectrically converted by said photoelectric converter, wherein a gate length of at least one MOSFET constituting the circuit block at a final stage side in said output circuit is set to be longer than the gate length of the MOSFET constituting the circuit block at the previous stage.

Moreover, according to the present invention, there is provided a solid image pickup apparatus comprising:

a photoelectric converter; and an output circuit, configured by connecting in series a plurality of stages of circuit blocks of at least one of a source follower circuit and an inverter, configured to output an electric signal in accordance with a signal charge photoelectrically converted by said photoelectric converter, wherein at least one MOSFET among two MOSFET constituting the circuit block at a final stage is selectively formed of a lightly doped drain (LDD) structure.

Furthermore, according to the present invention, there is provided a solid image pickup apparatus comprising:

a photoelectric converter; and an output circuit, configured by connecting in series a plurality of stages of circuit blocks of at least one of a source follower circuit and an inverter, configured to output an electric signal in accordance with a signal charge photoelectrically converted by said photoelectric converter, wherein a semiconductor element configured to relax an electric field is selectively inserted between two MOSFETs constituting the source follower circuit at a final stage among said plurality of stages of source follower circuits.

Additionally, according to the present invention, there is provided a solid image pickup apparatus comprising:

a photoelectric converter;

an output circuit configured to output an electric signal in accordance with a signal charge photoelectrically converted by said photoelectric converter;

a shielding film formed above at least said photoelectric converter; and a shielding member disposed in at least one of a semiconductor substrate between said photoelectric converter and said output circuit and/or between said semiconductor substrate and said shielding film.

According to the solid image pickup apparatus of the present invention, the emitted light caused by impact ionization is not easily incident upon the photoelectric converter, thereby improving image quality.

DESCRIPTION OF THE PREFERRED EMBODIMENTS

A solid image pickup apparatus according to the present invention will concretely be described hereinafter with reference to the drawings.

(First Embodiment)

A first embodiment is structured such that an impact ion is not easily generated at a rear stage in an output circuit 14. That is, in the first embodiment, an electric field is prevented from being high between source and drain of MOSFET in the output circuit 14, and therefore an electron/hole pair is inhibited from being generated by impact ionization.

Figure 1:
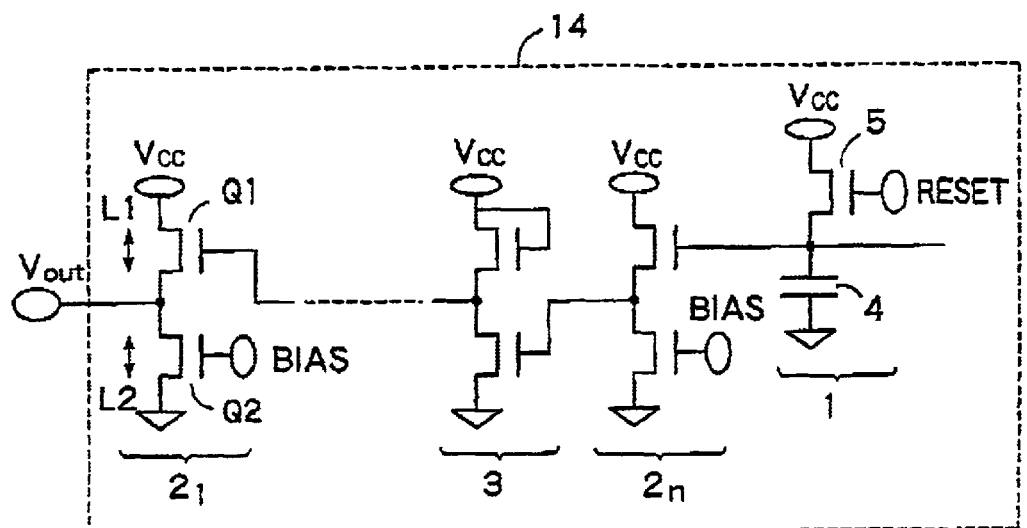
FIG. 1 is a circuit diagram showing a detailed configuration of an output circuit of a solid image pickup apparatus according to the present invention.
Figure 2:
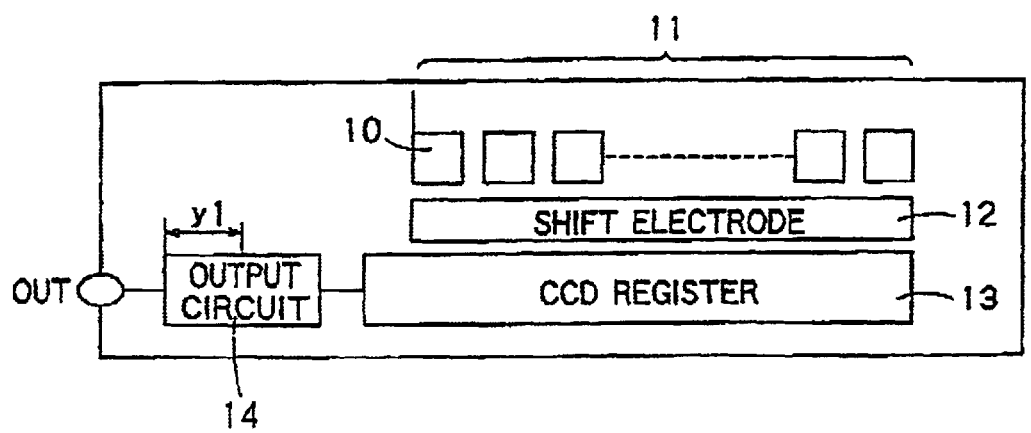
FIG. 2 is a plan view of the solid image pickup apparatus, showing a position in which MOSFET having a long gate length is formed.

FIG. 1 is a circuit diagram showing a detailed configuration of the output circuit 14 of the solid image pickup apparatus according to the present invention, and FIG. 2 is a plan view of the solid image pickup apparatus according to the present invention. The output circuit 14 shown in FIG. 1 includes a charge-voltage converter 1 for converting a charge transferred from a photoelectric converter 11 of FIG. 2 into a voltage signal, a plurality of stages of source follower circuits $2_1$ to $2_n$ for performing impedance conversion, and a reverse amplification circuit 3 disposed between the stages of the source follower circuits $2_1$ to $2_n$.

The charge-voltage converter 1 has a floating capacity 4 and a reset gate 5. The reset gate 5, source follower circuit 2, and reverse amplification circuit 3 are configured by combining MOSFETs.

The source follower circuit $2_1$ and so on at the rear stage in the output circuit 14 is structured such that much current can be passed in order to enhance a driving ability. Concretely, for example, a gate width is increased. However, when much current flows through MOSFET, impact ionization easily occurs as described above, and light emission by recombination easily occurs.

To solve the problem, in the first embodiment, gate lengths L1 and L2 of MOSFETs Q1 and Q2 in the final-stage source follower circuit $2_1$ in which the impact ionization most easily occurs inside the output circuit 14 of FIG. 1 are set to be longer than the gate length of MOSFET constituting another source follower circuit or the reverse amplification circuit 3.

Concretely, the gate lengths of the MOSFETs Q1, Q2 constituting the final-stage source follower circuit $2_1$ are set to such an extent that the impact ionization does not occur. Therefore, the impact ionization does not easily occur, an emitted light caused by the impact ionization does not easily enter the photoelectric converter 11, and an image quality can be prevented from being deteriorated.

(Second Embodiment)

In a second embodiment, some MOSFETs of a plurality of MOSFETs constituting the source follower circuit 2 have a structure in which the impact ionization does not easily occur.

The source follower circuit 2 has a current source configured by the MOSFET Q2. The electric field is more easily centralized and the impact ionization is more easily caused on a drain side of the MOSFET Q2 than in any other portion.

To solve the problem, in the second embodiment, only the MOSFET Q2 constituting the current source among the MOSFETs Q1 and Q2 constituting the final-stage source follower circuit $2_1$ in the output circuit 14 has a gate length longer than that of another MOSFET in the output circuit 14.

Therefore, similarly as the first embodiment, the emitted light caused by the impact ionization does not easily enter the photoelectric converter 11. Moreover, the number of MOSFETs long in gate length can be decreased as compared with the first embodiment. Therefore, a decrease of operation speed can be minimized, and a manufacturing process can be simplified.

Additionally, in the aforementioned first and second embodiments, the gate length of the MOSFET constituting the final-stage source follower circuit $2_1$ in the output circuit 14 is set to be longer than that of another MOSFET. However, the MOSFET having a long gate length is not necessarily limited to the source follower circuit $2_1$.

That is, as shown by an arrow y1 of FIG. 2, the gate lengths of at least several of the respective MOSFETs constituting the source follower circuit 2 at rear stage side in the output circuit 14 may be set to be longer than those of other MOSFETs.

(Third Embodiment)

In a third embodiment, MOSFET has a structure different from that in the first and second embodiments, so that the impact ionization does not easily occur.

Figure 3:
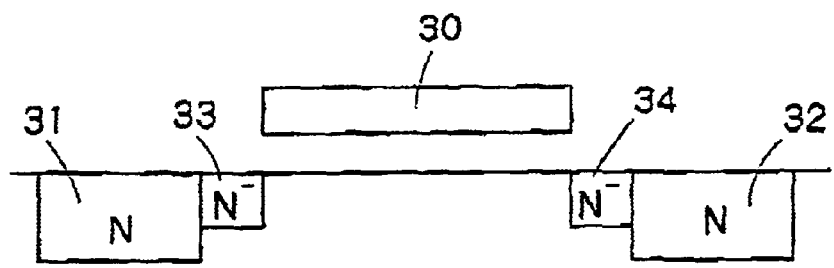
FIG. 3 is an explanatory view of a third embodiment of the solid image pickup apparatus according to the present invention.

FIG. 3 is an explanatory view of the third embodiment of the solid image pickup apparatus according to the present invention, and is a sectional view of the MOSFET constituting the source follower circuit $2_1$ at final stage in the output circuit 14. In the MOSFET of FIG. 3, a source region 31 and drain region 32 are formed into a lightly doped drain (LDD) structure on both sides of a gate electrode 30. Concretely, low-density regions 33, 34 are disposed in the source region 31 and drain region 32, respectively. Since the LDD structure is formed, concentration of the electric field in the source region 31 and drain region 32 can be relaxed, and the impact ionization does not easily occur.

Additionally, in FIG. 3, both the source region 31 and drain region 32 are formed into the LDD structure, but either one region, particularly only the drain region may be formed into the LDD structure. In this case, deterioration of a property of MOSFET is minimized.

Moreover, the MOSFET having the LDD structure is not necessarily limited to the source follower circuit 2 at final stage, but preferably at least several source follower circuits including the initial-stage source follower circuit are not formed into the LDD structure. In this case, a current to be passed through the output circuit 14 can be increased, and the property of the circuit is enhanced as compared with a case in which all circuits are formed into the LDD structure.

Concretely, at least several MOSFETs at the final stage shown by the arrow y1 of FIG. 2 are preferably formed into the LDD structure.

(Fourth Embodiment)

In a fourth embodiment, a new MOSFET for relaxing the electric field is added between two MOSFETs constituting the source follower circuit 2.

Figure 4:
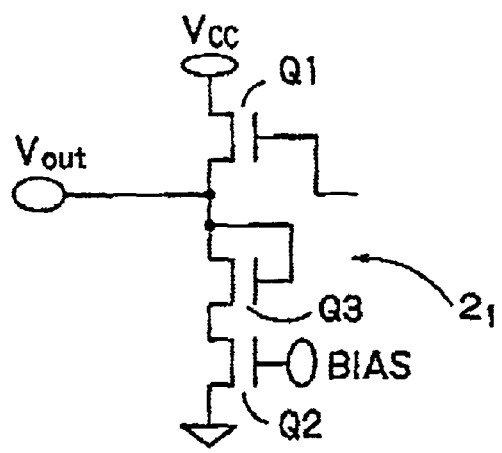
FIG. 4 is an explanatory view of a fourth embodiment of the solid image pickup apparatus according to the present invention.

FIG. 4 is an explanatory view of the fourth embodiment of the solid image pickup apparatus according to the present invention, and is a circuit diagram of the source follower circuit $2_1$ at final stage in the output circuit 14. The circuit of FIG. 4 has a configuration in which a MOSFET Q3 for relaxing the electric field is inserted between two MOSFETs Q1, Q2 constituting the source follower circuit $2_1$. The MOSFET Q3 short-circuits a drain terminal and gate terminal, and thereby serves as a diode.

Since the MOSFET Q3 is disposed, the concentration of the electric field on the drain side of the MOSFET Q2 constituting the current source can be relaxed, and the impact ionization does not occur.

Moreover, the source follower circuit in which the MOSFET Q3 is disposed is not necessarily limited to the source follower circuit $2_1$ at final stage, but to simplify the structure, it is preferable not to dispose the MOSFET Q3 in at least several source follower circuits including the circuit at initial stage.

Concretely, the transistor Q3 for relaxing the electric field as shown in FIG. 4 may be inserted in at least several source follower circuits 2 within an area at the final stage side shown by the arrow y1 of FIG. 2.

(Fifth Embodiment)

In a fifth embodiment, a shielding member is disposed in an incident route of the emitted light caused by the impact ionization, so that the emitted light does not enter the photoelectric converter.

Figure 5:
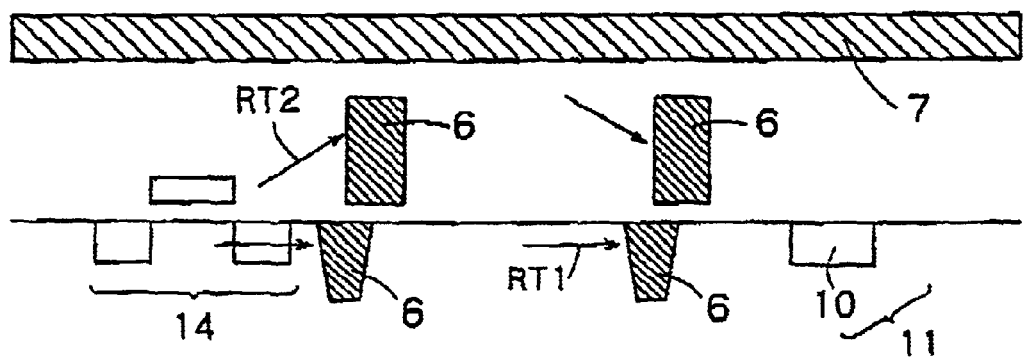
FIG. 5 is a sectional view of a fifth embodiment of the solid image pickup apparatus according to the present invention.

FIG. 5 is a sectional view of the fifth embodiment of the solid image pickup apparatus according to the present invention. The emitted light caused by the impact ionization generated in the output circuit 14 is passed through a route RT1 in a substrate, and a route RT2 between the substrate and a shielding film 7, and is incident upon the photoelectric converter 11.

In order to avoid the emitted light caused by the impact ionization and passed through the routes RT1, RT2 of FIG. 5, in the fifth embodiment, as shown in FIG. 5, shielding members 6 formed of aluminum or another material are disposed along the proceeding route of the emitted light caused by the impact ionization. Since the shielding members 6 are disposed, passage of the emitted light caused by the impact ionization can be interrupted, and the light is not incident upon the photoelectric converter 11.

Additionally, a shape and number of the shielding members 6 are not especially limited. However, the shielding member 6 is disposed at the rear stage in the output circuit 14 in which the impact ionization easily occurs. Then, the emitted light can efficiently be shielded by a small number of shielding members 6. Concretely, the member is preferably disposed at the final stage in the output circuit 14 shown by the arrow y1 of FIG. 2.

(Sixth Embodiment)

In the aforementioned first to fifth embodiments, examples of the solid image pickup apparatus having the CCD register as a transfer section have been described. However, solid image pickup apparatuses having no CCD register, such as a MOS sensor, also have a possibility that the image quality is deteriorated by generation of an impact ion.

To solve the problem, in a sixth embodiment, the impact ionization of the MOS sensor is prevented.

Figure 6:
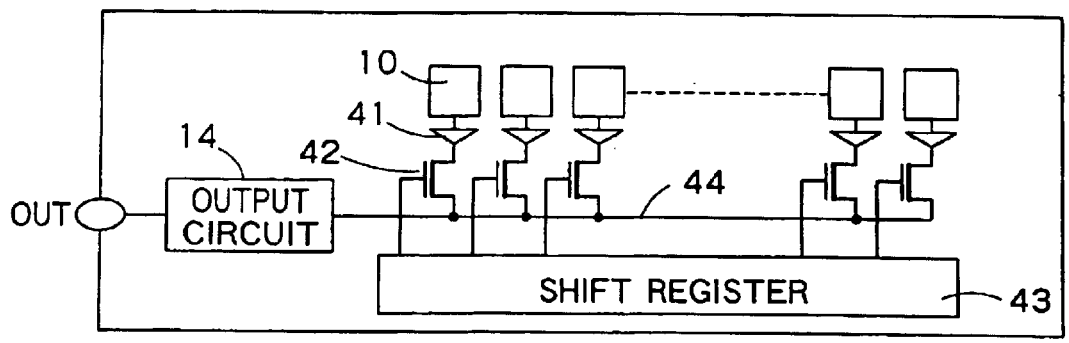
FIG. 6 is a schematic plan view of a linear sensor using MOS sensor.
Figure 7:
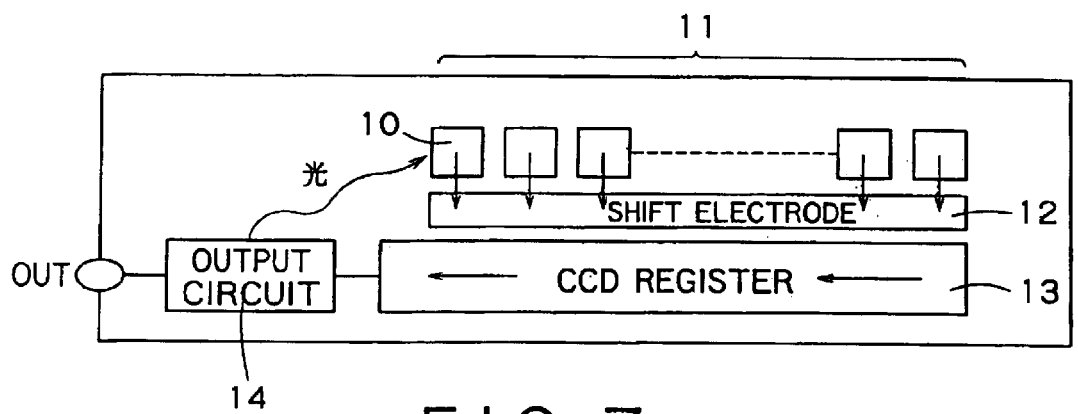
FIG. 7 is a plan view showing a schematic configuration of a CCD image sensor.
Figure 8:
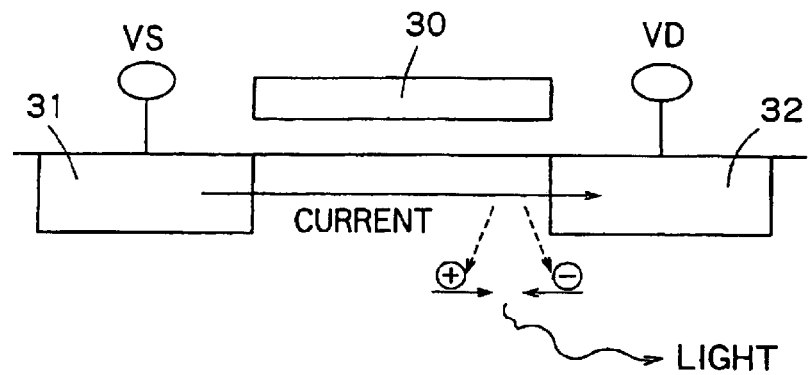
FIG. 8 is an explanatory view of an impact ion.

FIG. 6 is a schematic plan view of a linear sensor using the MOS sensor. The MOS sensor of FIG. 6 has a photoelectric converter 11, source follower circuit 41, MOS switch 42, and shift register 43 for each pixel. A source electrode of each MOS switch 42 is connected to an output line 44, and the output circuit 14 is connected to the other end of the output line 44.

The charge accumulated in each photoelectric converter 11 is converted to a voltage signal for each pixel in the source follower circuit 41. As omitted from FIG. 6, a charge storage section composed of a capacitor, and the like is disposed between the source follower circuit 41 and the MOS switch 42.

The shift register 43 turns on the MOS switches 42 in order. When each MOS switch 42 turns on, an output signal of the corresponding source follower circuit 41 is inputted into the output circuit 14 via the output line.

The output circuit 14 is constituted similarly as FIG. 1. The gate length of at least one MOSFET constituting the source follower circuit at final stage side of the output circuit 14 is set to be longer than the gate length of the MOSFET constituting the source follower circuit at previous stage. Therefore, similarly as the first to fifth embodiments, the impact ion is not easily generated and the image quality is enhanced.

Moreover, in the linear sensor using the MOS sensor, among the MOSFETs Q1, Q2 constituting the source follower circuit of the output circuit 14 at final stage, the gate length of only the MOSFET Q2 constituting the current source may be set to be longer than the gate length of any other MOSFET in the output circuit 14.

Furthermore, in the linear sensor using the MOS sensor, the source region 31 and drain region 32 of the MOSFET constituting the final-stage source follower circuit $2_1$ in the output circuit 14 may be formed into the LDD structure.

Additionally, in the linear sensor using the MOS sensor, as shown in FIG. 4, the MOSFET Q3 for relaxing the electric field may be inserted between two MOSFETs Q1 and Q2 constituting the source follower circuit $2_1$ at final stage in the output circuit 14.

Moreover, in the linear sensor using the MOS sensor, as shown in FIG. 5, the shielding member may be disposed along the proceeding route of the emitted light.

What is claimed is:

1. A solid image pickup apparatus comprising:
    a photoelectric converter; and
    an output circuit, configured by connecting in series a plurality of stages of circuit blocks of at least one of a source follower circuit and an inverter configured to output an electric signal in accordance with a signal charge photoelectrically converted by said photoelectric converter,
    wherein a gate length of at least one MOSFET constituting the circuit block at a final stage side in said output circuit is set to be longer than the gate length of the MOSFET constituting the circuit block at the previous stage.

2. The solid image pickup apparatus according to claim 1 wherein the gate length of only the MOSFET constituting a current source out of two MOSFETs constituting said circuit block at the final stage in said output circuit is set to be longer than the gate lengths of the other MOSFET and the MOSFET constituting the circuit block at the previous stage.

3. The solid image pickup apparatus according to claim 1 wherein said output circuit further comprises an inverter composed of the MOSFET disposed between the stages of said plurality of circuit blocks connected in series, and
    the gate length of at least one MOSFET constituting the circuit block at the final stage in said output circuit is set to be longer than the gate length of the MOSFET constituting said inverter.

4. The solid image pickup apparatus according to claim 1, further comprising a transfer section configured to successively transfer the signal charge photoelectrically converted by said photoelectric converter in a predetermined direction,
    wherein said output circuit outputs the electric signal in accordance with the signal charge transferred from said transfer section.

5. The solid image pickup apparatus according to claim 1, further comprising:
    a plurality of voltage conversion circuits configured to convert the charge accumulated in said photoelectric converter into a voltage signal for each pixel;
    a plurality of MOS transistors which are disposed for said plurality of voltage conversion circuits, respectively, and which can supply the voltage signal converted by said corresponding voltage conversion circuit to said output circuit; and
    a shift register configured to control an on/off state of said plurality of MOS transistors.

* * * * *